United States Patent [19]
Uematsu et al.

[11] 4,194,162
[45] Mar. 18, 1980

[54] SEMICONDUCTOR DEVICE

[75] Inventors: Yutaka Uematsu, Yokosuka; Yoichi Unno, Kamakura, both of Japan

[73] Assignee: Tokyo Shibaura Electric Co., Ltd., Kawasaki, Japan

[21] Appl. No.: 889,115

[22] Filed: Mar. 22, 1978

[30] Foreign Application Priority Data

Apr. 6, 1977 [JP] Japan ................................. 52-38574

[51] Int. Cl.$^2$ .............................................. H01S 3/19
[52] U.S. Cl. .................................. 330/4.3; 350/96.17;
350/96.19; 331/94.5 H
[58] Field of Search ....................... 307/312; 350/96.17,
350/96.19; 331/94.5 H; 330/4.3; 357/19

[56] References Cited

U.S. PATENT DOCUMENTS

| | | | |
|---|---|---|---|
| 3,242,440 | 3/1966 | Koester et al. | 331/94.5 M |
| 3,724,926 | 4/1973 | Lee | 357/19 |
| 4,093,345 | 6/1978 | Logan et al. | 331/94.5 H |

FOREIGN PATENT DOCUMENTS

53-11589  2/1978 Japan ........................................ 350/96.17

OTHER PUBLICATIONS

Tsukada et al., "Q-Switching of Semiconductor Lasers", 2/77, p. 37, IEEE Jour. Quant. Elec., vol. QE5, #2.
Yen et al., "GaAs Distributed Bragg Reflector Lasers", 6/76, pp. 213-218, Optics Comm., vol. 17, #3.
Kazarinov et al., "Injection Hetrojunction ... Surface", 1/73, pp. 1184-1189, Soviet Physics Semiconductors, vol. 6, #7.
Taylor et al., "Guided Wave Optics", 8/74, pp. 1044-1060, Proceeding of the IEEE, vol. 62, #8.

*Primary Examiner*—Nelson Moskowitz
*Attorney, Agent, or Firm*—Oblon, Fisher, Spivak, McClelland & Maier

[57] ABSTRACT

A semiconductor device includes a semiconductor layer on one side of a semiconductor body to define a pn-junction therebetween, diffraction gratings formed at a distance from each other on the top of said semiconductor layer, and electrodes formed between the diffraction gratings on the top of said semiconductor and formed on the other side of the semiconductor body.

3 Claims, 2 Drawing Figures

SEMICONDUCTOR DEVICE

BACKGROUND OF THE INVENTION

This invention relates to a semiconductor device, more specifically to an amplifier circuit having a light amplifying function.

Increasing demands are asked for light amplifying circuits accompanying the development of the light communication technology. Heretofore, there have not existed any such semiconductor devices that singly have the light amplifying function, and conventionally used with the regenerative amplifier circuits to perform light-electricity-light conversion. However, these circuits are subject to some defects including complicated construction and large overall size. Thus, there is required a compact semiconductor device singly having the light amplifying function.

SUMMARY OF THE INVENTION

Accordingly, an object of this invention is to provide a semiconductor device with light amplifying function which is simple in construction and may be compacted.

Another object of the invention is to provide a semiconductor device with light branching function.

DETAILED DESCRIPTION OF THE PREFERRED EMBODIMENTS

Now there will be described the semiconductor device according to an embodiment of this invention with reference to the accompanying drawing.

Figure 1:
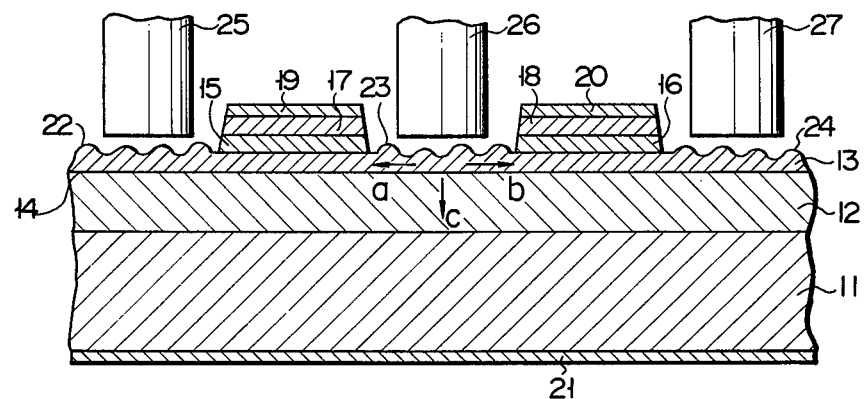
FIG. 1 is a sectional view of a semiconductor device with light amplifying and light branching functions according to an embodiment of this invention.

Referring now to FIG. 1 which shows the semiconductor device applied to a photo-relay for light communication, number 11 designates an n-type GaAs substrate doped with silicon. Laid on top of the substrate 11 is an n-type $Ga_{0.7}Al_{0.3}As$ layer 12 doped with tin and having an about 3μm thickness. Further, on the layer 12 there is formed as a photoconductive path a p-type GaAs layer 13 doped with silicon and having an about 0.5 μm thickness, a pn-junction 14 being defined between these layers 12 and 13. Provided on the GaAs layer 13 are two p-type $Ga_{0.7}Al_{0.3}As$ layers 15 and 16 doped with germanium, these two layers being disposed at a predetermined distance from each other in the width direction. These layers 15 and 16 are formed in the shape of a strip of about 3 μm thickness, each longitudinal end of the layers extending to the vicinity of each corresponding end of the photoconductive path 13. Disposed on the layers 15 and 16 are p-type GaAs layers 17 and 18 doped with germanium and having an about 2 μm thickness, respectively. Formed on the layers 17 and 18 are first and second electrodes 19 and 20. In addition, a third electrode 21 is provided on the bottom face of the substrate 11.

Diffraction gratings 22, 23 and 24 are formed on three exposed surface portions of the photoconductive path or GaAs layer 13 separated from one another by the strip layers 15 and 16, that is, portions having no strip layers formed thereon. These diffraction grids have wavy patterns extending in the transverse direction as in FIG. 1, and are so formed as to have their period T set at a value given as follows:

$$T = (m\lambda_0/n_{eff})$$

Here, $\lambda_0$ is the center wavelength of the light incident upon the semiconductor device, neff is the equivalent refractive index of the photoconductive path 13, and m is a positive integral member.

In a preferred embodiment of the invention, the diffraction gratings are formed with T=5,500 Å calculated on the basis of m=2, $\lambda_0$=8,900 Å, and neff=approx. 3.23.

In the semiconductor device with the aforementioned construction, the layers and diffraction grids may easily be formed by the liquid-phase growth method and a combination of the photolithography, biflux interference method, and chemical etching method, respectively.

Numerals 25, 26 and 27 designates light fibers with their respective tip ends disposed close to the diffraction gratings 22, 23 and 24.

Now there will be described the operation of thus constructed semiconductor device. A ray of light with $\lambda_0$=8,900 Å is applied from the central fiber 26 to the diffraction grid 23. In this case, the diffraction grid 23 functions as a photo-input coupling portion, and the light through this portion travels splitting in the left (arrow a), right (arrow b), and downward (arrow c) directions with respect to the photoconductive path. The intensity ratio of these splitted components of light may be determined according to the shape and depth of the central diffraction grating 23. When a fixed voltage is applied between the first and second electrodes 19 and 20, and the third electrode 21 to cause a current flow between them, substantially equivalent beams of light amplified in proportion to the applied voltage are emitted from the two diffraction gratings 22 and 24, and rendered incident upon the light-fibers 25 and 27. This is done because the beams of light individually travelling through the photoconductive path 13 in the directions indicated by arrows a and b are amplified as they pass right under the p-type $Ga_{0.7}Al_{0.3}As$ layers 15 and 16, the amplified beams being radiated upward from the diffraction gratings 22 and 24.

As may be seen from the above description, the light may be amplified and radiated from the diffraction gratings by disposing the electrode and diffraction grating on the photoconductive path 13 along the light travelling direction and applying a current to the travelling wave this side of the diffraction grating in the photoconductive path. Further, if a plurality of electrodes and diffraction gratings are provided, then the beams of light incident branched off inside the photoconductive path will be able to be taken out from the respective diffraction grids, thus exhibiting the function of the device as a light branching circuit.

Although the semiconductor device of the aforesaid embodiment has a double hetero-junction construction, it is to be understood that this invention is not limited to such precise construction, and that various changes and modifications may be effected therein with respect to the (materials) forming the substrate and layers as well as the conductivity type thereof by one skilled in the art without departing from the scope or spirit of the invention.

Meanwhile, the device with the aforesaid construction may be used also for photosynthesis (synthesis of light). If beams of light emitted from the light-fibers 25 and 27 on both sides are rendered incident upon their corresponding diffraction gratings 22 and 24, for example, the light components among the beams of light incident travelling toward the central diffraction grating 23 will be amplified respectively at portions right under the electrodes 19 and 20, and then radiated outward from the diffraction grating 23 to be incident upon the central light-fiber, whereby synthesis of light may be achieved.

Figure 2:
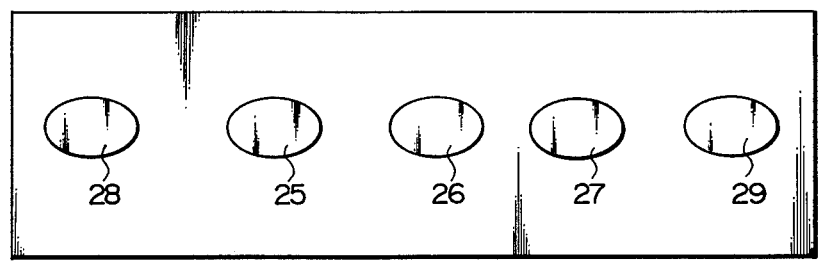
FIG. 2 is a plan view of a semiconductor device according to another embodiment of the invention.

Although three light-fibers 25, 26 and 27 are used in the above embodiment, it is to be understood that the number of light-fibers is not limited to this, and that additional two light-fibers 28 and 29 as shown in FIG. 2 may be disposed on each outer side of the light-fibers 25 and 27, for example.

What we claim is:

1. A semiconductor device comprising a semiconductor body, a semiconductor layer as a photoconductive path disposed on one side of said body and defining a pn-junction between said layer and body, first and second diffraction gratings formed at a distance from each other on top of said semiconductor layer, a first electrode disposed between said first and second diffraction gratings on top of said semiconductor layer, a second electrode disposed on the other side of said semiconductor body so as to face said first electrode, a third diffraction grating formed at a distance from said first diffraction grating on top of said semiconductor layer and a third electrode disposed between said first and third diffraction gratings on top of said semiconductor layer.

2. A semiconductor device according to claim 1 further comprising a first light-fiber having one end facing said first diffraction grating and rendering beams of light incident upon said first diffraction grating, and second and third light-fibers having each one end facing said second and third diffraction gratings and receiving beams of light radiated from said second and third diffraction gratings.

3. A semiconductor device according to claim 2, wherein said semiconductor body includes a semiconductor substrate of one conductivity type with said second electrode disposed on one side thereof and a first semiconductor layer of the same conductivity type disposed on the other side of said semiconductor substrate and formed of a material different from that of said substrate, and said photoconductive path semiconductor layer is disposed on top of said first semiconductor layer and includes a second semiconductor layer of a conductivity type opposite to that of said first semiconductor layer.

* * * * *